(12) United States Patent
Nam et al.

(10) Patent No.: US 12,261,171 B2
(45) Date of Patent: Mar. 25, 2025

(54) SEMICONDUCTOR DEVICES WITH CIRCUIT ACTIVE ELEMENTS AND DUMMY ACTIVE ELEMENTS

(71) Applicant: Samsung Electronics Co., Ltd., Suwon-si (KR)

(72) Inventors: Seonah Nam, Yongin-si (KR); Byungju Kang, Seoul (KR); Byungsung Kim, Suwon-si (KR); Hyelim Kim, Asan-si (KR); Sungho Park, Suwon-si (KR); Yubo Qian, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/416,375

(22) Filed: Jan. 18, 2024

(65) Prior Publication Data

US 2024/0162226 A1    May 16, 2024

Related U.S. Application Data

(63) Continuation of application No. 17/880,819, filed on Aug. 4, 2022, now Pat. No. 11,908,855, which is a
(Continued)

(30) Foreign Application Priority Data

Dec. 10, 2019  (KR) .................. 10-2019-0163999

(51) Int. Cl.
*H01L 27/088* (2006.01)
*B82Y 10/00* (2011.01)
(Continued)

(52) U.S. Cl.
CPC ........ *H01L 27/088* (2013.01); *H01L 23/5384* (2013.01); *H01L 29/0653* (2013.01); *H01L 29/4232* (2013.01)

(58) Field of Classification Search
CPC ......... H01L 21/823437; H01L 27/0207; H01L 29/0653

See application file for complete search history.

(56) References Cited

U.S. PATENT DOCUMENTS

| 5,885,856 A | 3/1999 | Gilbert et al. |
| 8,519,389 B2 | 8/2013 | Matsubara |

(Continued)

FOREIGN PATENT DOCUMENTS

| CN | 101521228 A | 9/2009 |
| GB | 2345382 A | 7/2000 |

(Continued)

OTHER PUBLICATIONS

Korean Office Action dated Dec. 10, 2024 for corresponding Korean Application No. 10-2019-0163999.

(Continued)

*Primary Examiner* — Sonya McCall-Shepard
(74) *Attorney, Agent, or Firm* — Harness, Dickey & Pierce, P.L.C.

(57) ABSTRACT

A semiconductor device includes first and second external dummy areas, and a circuit area between the first and second external dummy areas. The circuit area includes circuit active regions and circuit gate lines. Each external dummy area includes an external dummy active region and external dummy gate lines overlapping the external dummy active region and spaced apart from the circuit gate lines. The external dummy active region has a linear shape extending in a first horizontal direction or a shape including active portions isolated from direct contact with each other and extending sequentially in the first horizontal direction. The circuit active regions are between the first and second external dummy active regions and include a first plurality of circuit active regions extending sequentially in the first horizontal direction and a second plurality of circuit active
(Continued)

regions extending sequentially in a second horizontal direction perpendicular to the first horizontal direction.

20 Claims, 12 Drawing Sheets

Related U.S. Application Data continuation of application No. 17/024,044, filed on Sep. 17, 2020, now Pat. No. 11,410,994.

(51) Int. Cl.
*H01L 21/8234* (2006.01)
*H01L 23/538* (2006.01)
*H01L 27/02* (2006.01)
*H01L 29/06* (2006.01)
*H01L 29/417* (2006.01)
*H01L 29/423* (2006.01)
*H01L 29/775* (2006.01)
*H01L 29/78* (2006.01)

(56) References Cited

U.S. PATENT DOCUMENTS

| | | | |
|---|---|---|---|
| 9,773,785 B2 | 9/2017 | Chang et al. |
| 9,818,875 B1 | 11/2017 | Bi et al. |
| 9,893,070 B2 | 2/2018 | Wang et al. |
| 10,096,714 B2 | 10/2018 | Chung et al. |
| 2006/0258151 A1 | 11/2006 | Young |
| 2007/0004154 A1 | 1/2007 | Hong et al. |
| 2009/0317749 A1 | 12/2009 | Lee |
| 2015/0228649 A1 | 8/2015 | Singh et al. |
| 2018/0047667 A1 | 2/2018 | Uchida et al. |
| 2019/0051600 A1 | 2/2019 | Oh et al. |
| 2019/0252372 A1 | 8/2019 | Jun et al. |

FOREIGN PATENT DOCUMENTS

| | | |
|---|---|---|
| KR | 10-1998-0018847 A | 6/1998 |
| KR | 10-1997-0030674 | 12/1998 |
| KR | 10-2000-0046449 A | 7/2000 |
| KR | 10-2002-0070801 A | 9/2002 |
| KR | 10-2003-0002298 A | 1/2003 |
| KR | 10-0640535 B1 | 10/2006 |
| KR | 10-2007-0001454 A | 1/2007 |
| KR | 10-0676606 B1 | 1/2007 |
| KR | 10-2009-0071045 A | 7/2009 |
| KR | 10-2009-0071733 A | 7/2009 |
| KR | 10-2009-0131498 A | 12/2009 |
| KR | 10-2012-0004774 A | 1/2012 |
| KR | 10-2018-0038239 A | 4/2018 |
| KR | 10-2019-0017528 A | 2/2019 |

OTHER PUBLICATIONS

Chinese Office Action dated Dec. 13, 2024 for corresponding Chinese Application No. 202011400976.X.

SEMICONDUCTOR DEVICES WITH CIRCUIT ACTIVE ELEMENTS AND DUMMY ACTIVE ELEMENTS

CROSS-REFERENCE TO RELATED APPLICATIONS

This application is a continuation of U.S. application Ser. No. 17/880,819, filed on Aug. 4, 2022, which is a continuation of U.S. application Ser. No. 17/024,044, filed on Sep. 17, 2020, which claims the benefit under 35 U.S.C. § 119 of Korean Patent Application No. 10-2019-0163999 filed on Dec. 10, 2019 in the Korean Intellectual Property Office, the entire disclosure of each of which is incorporated herein by reference for all purposes.

BACKGROUND

The present inventive concepts relate to semiconductor devices, and more particularly, to semiconductor devices including an active region including a circuit active region and a dummy area including a dummy active region.

As demand for high performance, high speed, and/or multifunctionality of semiconductor devices increases, the degree of integration of semiconductor devices is increasing. As the degree of integration of semiconductor devices increases, the size of components such as circuit active regions and the like is reduced. Thus, the reliability of the circuit active region which becomes small in size becomes low.

SUMMARY

Some example embodiments of the present inventive concepts provide semiconductor devices in which the degree of integration may be improved.

Some example embodiments of the present inventive concepts provide semiconductor devices in which reliability may be improved while improving the degree of integration.

According to some example embodiments of the present inventive concepts, a semiconductor device includes a first external dummy area, a second external dummy area, and a circuit area between the first external dummy area and the second external dummy area. The circuit area includes circuit active regions and circuit gate lines, the first external dummy area includes a first external dummy active region and first external dummy gate lines overlapping the first external dummy active region and spaced apart from the circuit gate lines, the second external dummy area includes a second external dummy active region and second external dummy gate lines overlapping the second external dummy active region and spaced apart from the circuit gate lines, each of the first and second external dummy active regions has a linear shape extending in a first horizontal direction or has a shape including active portions spaced apart from each other while being arranged in the first horizontal direction, and the circuit active regions are provided as a plurality of circuit active regions arranged in the first horizontal direction and are provided as a plurality of circuit active regions arranged in a second horizontal direction perpendicular to the first horizontal direction, between the first and second external dummy active regions.

According to some example embodiments of the present inventive concepts, a semiconductor device includes a circuit area, an external dummy area adjacent the circuit area, and a gate cut insulation region between the circuit area and the external dummy area. The external dummy area includes an external dummy active region and external dummy gate lines overlapping the external dummy active region, the circuit area includes a plurality of circuit active regions facing the external dummy active region and arranged in a first horizontal direction, and circuit gate lines overlapping the plurality of circuit active regions, the external dummy active region has a linear shape extending in a first horizontal direction, or has a shape including active portions spaced apart from each other while being sequentially arranged in the first horizontal direction, the gate cut insulation region includes gate cut patterns interposed between the circuit gate lines and the external dummy gate lines and separating the circuit gate lines and the external dummy gate lines, and the gate cut patterns are arranged in the first horizontal direction.

According to some example embodiments of the present inventive concepts, a semiconductor device includes a circuit area, and an external dummy area adjacent to the circuit area. The external dummy area includes an external dummy active region extending in a first horizontal direction, and external dummy gate lines overlapping the external dummy active region and extending in a second horizontal direction perpendicular to the first horizontal direction, the circuit area includes circuit active regions facing the external dummy active region and arranged in plural in the first horizontal direction, and circuit gate lines overlapping the circuit active regions and extending in the second horizontal direction, the external dummy active region has a linear shape extending in the first horizontal direction, or has a shape including active portions spaced apart from each other while being arranged in sequence in the first horizontal direction, the circuit active regions include a first side circuit active region and a second side circuit active region adjacent to the external dummy active region, a separation distance between the external dummy active region and the first side circuit active region is less than a separation distance between the external dummy active region and the second side circuit active region, and other circuit active regions are not interposed between the first external dummy active region and the first side circuit active region and between the first external dummy active region and the second side circuit active region.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, semiconductor devices and methods of forming the same according to some example embodiments will be described with reference to the accompanying drawings.

First, a planar structure of a semiconductor device according to some example embodiments will be described with reference to FIG. 1A.

Figure 1A:
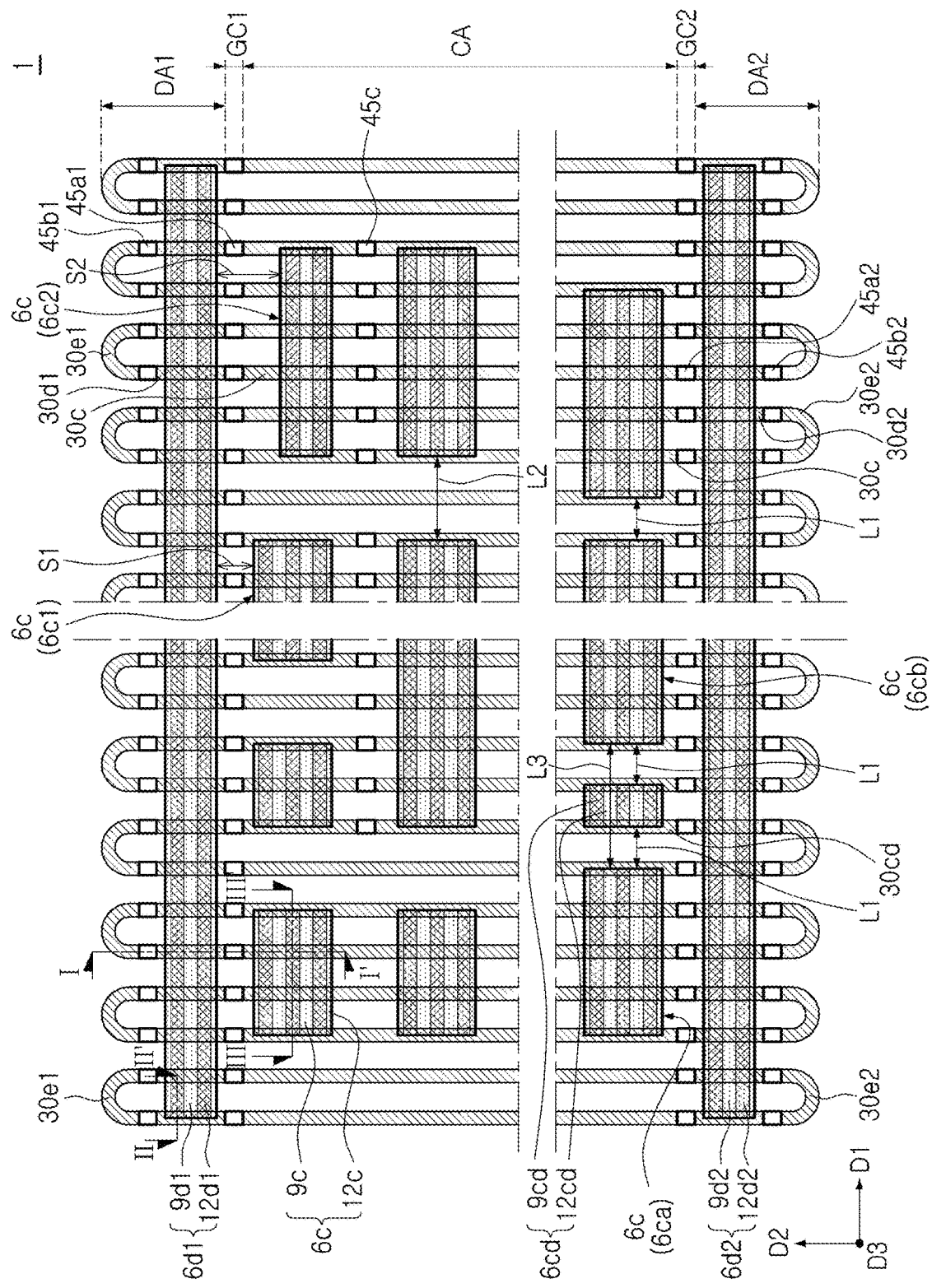
FIG. 1A is a plan view illustrating a semiconductor device according to some example embodiments.

FIG. 1A is a plan view illustrating a semiconductor device according to some example embodiments.

Referring to FIG. 1A, a semiconductor device 1 according to some example embodiments may include a first external dummy area DA1, a second external dummy area DA2, and a circuit area CA between the first external dummy area DA1 and the second external dummy area DA2. It will be understood that at least one external dummy area of the first or second external dummy areas DA1 and DA2 may, in some example embodiments, be adjacent to the circuit area CA.

The semiconductor device 1 may include a first gate cut insulation region GC1 between the first external dummy area DA1 and the circuit area CA, and a second gate cut insulation region GC2 between the second external dummy area DA2 and the circuit area CA.

The circuit area CA may include circuit active regions 6c and circuit gate lines 30c. The circuit gate lines 30c may include gate lines overlapping the circuit active regions 6c (e.g., overlapping in the vertical direction D3). Each of the circuit active regions 6c may have a linear shape or a bar shape extending in a first horizontal direction D1. Each of the circuit gate lines 30c may have a linear shape or a bar shape extending in a second horizontal direction D2 perpendicular to the first horizontal direction D1. As shown, the circuit gate lines 30c may be understood to be arranged in parallel in the first horizontal direction D1, such that the circuit gate lines 30c extend in parallel in the second horizontal direction D2. As shown, at least some of the circuit active regions 6c may be spaced apart from each other (e.g., isolated from direct contact with each other) in the first horizontal direction D1.

The circuit area CA may further include an internal dummy active region 6cd and internal dummy gate lines 30cd overlapping the internal dummy active region 6cd.

The circuit active regions 6c may include a first circuit active region 6ca and a second circuit active region 6cb spaced apart (e.g., isolated from direct contact with each other) by a distance L3 greater than allowable distance ranges L1 and L2. The first circuit active region 6ca and the second circuit active region 6cb may be spaced apart from each other in the first horizontal direction D1.

Among the circuit active regions 6c arranged in the first horizontal direction D1, the remaining circuit active regions except for the first and second circuit active regions 6ca and 6cb are spaced apart from each other (e.g., isolated from direct contact with each other) by the allowable distance range L1 or L2, and the internal dummy active region 6cd may be disposed between the first circuit active region 6ca and the second circuit active region 6cb. For example, among the circuit active regions 6c adjacent in the first horizontal direction D1, some circuit active regions may be spaced apart by a first distance L1, some other circuit active regions may be spaced apart by a second distance L2 greater than the first distance L1, and some other circuit active regions may be spaced apart by a third distance L3 greater than the second distance L2. In this case, the first distance L1 and the second distance L2 may be within an allowable distance range, and the third distance L3 may include both cases greater than the allowable distance ranges L1 and L2. The third distance L3 is not limited to a specific numerical value or a specific size value.

The separation distance L1 between the first circuit active region 6ca and the internal dummy active region 6cd and the separation distance L1 between the second circuit active region 6cb and the internal dummy active region 6cd may each be within the allowable distance ranges L1 and L2.

Each of the circuit active regions 6c may include a circuit active pattern 12c. The circuit active pattern 12c may include line patterns parallel to each other. The line patterns of the circuit active pattern 12c may extend in the first horizontal direction D1.

Each of the circuit active regions 6c may further include a circuit base pattern 9c overlapping the circuit active pattern 12c.

Portions of the circuit active regions 6c may have different widths in the second horizontal direction D2.

The internal dummy active region 6cd may be disposed between the first circuit active region 6ca and the second circuit active region 6cb. The internal dummy active region 6cd may be spaced apart from the first circuit active region 6ca and the second circuit active region 6cb. Each internal dummy active region 6cd may further include an internal dummy base pattern 9cd overlapping an internal dummy active pattern 12cd.

The distance L1 between the internal dummy active region 6cd and the first circuit active region 6ca and the distance L1 between the internal dummy active region 6cd and the second circuit active region 6cb may be the first distance L1.

The first external dummy area DA1 may include a first external dummy active region 6d1 and first external dummy gate lines 57d overlapping the first external dummy active region 6d1 (e.g., overlapping in the vertical direction D3) and spaced apart from (e.g., isolated from direct contact with) the circuit gate lines 30c. The second external dummy area DA2 may include a second external dummy active region 6d2 and second external dummy gate lines 30d2 overlapping the second external dummy active region 6d2 (e.g., overlapping in the vertical direction D3) and spaced apart from the circuit gate lines 30c. As shown in FIG. 1A, each external dummy active region of the first external dummy active region 6d1 and the second external dummy active region 6d2 may have a linear shape extending in the first horizontal direction D1.

Between the first and second external dummy active regions 6d1 and 6d2, the circuit active regions 6c include a plurality of the circuit active regions 6c that are arranged in the first horizontal direction D1, and a plurality of the circuit active regions 6c that are arranged in the second horizontal direction D2. The circuit active regions 6c arranged (e.g., extending sequentially) in the first horizontal direction D1 may be referred to as a first plurality of circuit active regions 6c, and the circuit active regions 6c arranged (e.g., extending sequentially) in the second horizontal direction D2 may be referred to as a second plurality of circuit active regions 6c, and the second plurality of circuit active regions 6c may include one or more circuit active regions of the first plurality of circuit active regions 6c. As shown in FIG. 1A, at least one external dummy active region of the first external dummy active region 6d1 or the second external dummy active region 6d2 may extend farther in the first horizontal direction D1 than an end of a circuit active region 6c that is a last circuit active region 6c among the circuit active regions 6c extending sequentially in the first horizontal direction (e.g., the last circuit active region 6c of a linear sequence of circuit active regions 6c extending in the first horizontal direction).

Some of the circuit active regions 6c may have different lengths in the first horizontal direction D1. Some of the circuit active regions 6c may have different widths in the second horizontal direction D2.

The circuit active regions 6c may include a first side circuit active region 6c1 and a second side circuit active region 6c2, where the first side circuit active region 6c1 and the second side circuit active region 6c2 are both adjacent to the first external dummy active region 6d1.

Other circuit active regions (e.g., circuit active regions 6c that exclude the first side circuit active region 6c1 and the second side circuit active region 6c2) may not be disposed between the first external dummy active region 6d1 and the first side circuit active region 6c1, and the other circuit active regions may not be disposed between the first external dummy active region 6d1 and the second side circuit active region 6c2.

In some example embodiments, the separation distance S1 between the first external dummy active region 6d1 and the first side circuit active region 6c1 may be different from the separation distance S2 between the first external dummy active region 6d1 and the second side circuit active region 6c2.

In some example embodiments, the separation distance S1 between the first external dummy active region 6d1 and the first side circuit active region 6c1 may be less than the separation distance S2 between the first external dummy active region 6d1 and the second side circuit active region 6c2.

The first external dummy area DA1 may further include first edge gate lines 30e1. The second external dummy area DA2 may further include second edge gate lines 30e2.

As shown in at least FIG. 1A, the first external dummy gate lines 30d1 may have the shape of lines or bars parallel to each other, and the second external dummy gate lines 30d2 may have the shape of lines or bars parallel to each other. As shown in at least FIG. 1A, the first external dummy gate lines 30d1 may be between the first edge gate lines 30e1 and the circuit gate lines 30c. As shown in at least FIG. 1A, second external dummy gate lines 30d2 may be between the second edge gate lines 30e2 and the circuit gate lines 30c.

In some example embodiments, at least some (e.g., at least portions) of the first edge gate lines 30e1 may have a "U" shape (e.g., may be "U" shaped). At least some of the second edge gate lines 30e2 may have a "U" shape.

The first gate cut region GC1 may include first gate cut patterns 45a1 sequentially arranged (e.g., extending sequentially) in the first horizontal direction D1. The first gate cut patterns 45a1 may be disposed between the first external dummy gate lines 30d1 of the first external dummy area DA1 and the circuit gate lines 30c of the circuit area CA (e.g., such that each separate first gate cut pattern 45a1 may be between a separate first external dummy gate line 30d1 and a separate circuit gate line 30c) to separate (e.g., isolate from direct contact) the first external dummy gate lines 30d1 from the circuit gate lines 30c. The first external dummy gate lines 30d1 and the circuit gate lines 30c may be separated (e.g., isolated from direct contact with each other) by being spaced apart in the second horizontal direction D2 by the first gate cut patterns 45a1.

The second gate cut region GC2 may include second gate cut patterns 45a2 that are sequentially arranged (e.g., extending sequentially) in the first horizontal direction D1. The second gate cut patterns 45a2 may be interposed between the second external dummy gate lines 30d2 of the second external dummy area DA2 and the circuit gate lines 30c of the circuit area CA (e.g., such that each separate second gate cut pattern 45a2 may be between a separate second external dummy gate line 30d2 and a separate circuit gate line 30c). The second external dummy gate lines 30d2 and the circuit gate lines 30c may be separated (e.g., isolated from direct contact with each other) by being spaced apart in the second horizontal direction D2 by the second gate cut patterns 45a2.

The circuit area CA may further include circuit gate cut patterns 45c separating the circuit gate lines 30c in the second horizontal direction D2 in the circuit area CA.

The first external dummy area DA1 may further include first edge cut patterns 45b1 between the first edge gate lines 30e1 and the first external dummy gate lines 30d1. The first edge cut patterns 45b1 may separate the first edge gate lines 30e1 and the first external dummy gate lines 30d1 (e.g., isolate the first edge gate lines 30e1 and the first external dummy gate lines 30d1 from direct contact with each other) in the second horizontal direction D2. As shown, the first external dummy gate lines 30d1 may be between the first edge cut patterns 45b1 and the first gate cut patterns 45a1. In some example embodiments, at least portions of (e.g., some or all of) the first and/or second edge cut patterns 45b1 and 45b2 may have a "U" shape.

The second external dummy area DA2 may further include second edge cut patterns 45b2 between the second edge gate lines 30e2 and the second external dummy gate lines 30d2. The second edge cut patterns 45b2 may separate the second edge gate lines 30e2 and the second external dummy gate lines 30d2 in the second horizontal direction D2.

In some example embodiments, the first and second gate cut patterns 45a1 and 45a2, the circuit gate cut patterns 45c, and the first and second edge cut patterns 45b1 and 45b2 may be formed of (e.g., may at least partially include and/or may be completely comprised of) the same insulating material, such as a silicon oxide, a silicon oxynitride or a silicon nitride.

In some example embodiments, the first external dummy area DA1 and the second external dummy area DA2 may be formed in a mirror symmetrical structure with the circuit area CA interposed therebetween.

The first external dummy active region 6d1 may include a first dummy active pattern 12d1. The second external dummy active region 6d2 may include a second dummy active pattern 12d2.

Each of the first and second external dummy active regions 6d1 and 6d2 may have a linear shape extending in the first horizontal direction D1.

In some example embodiments, the first dummy active pattern 12d1 may include a plurality of line patterns parallel to each other. The line patterns of the first dummy active pattern 12d1 may extend in the first horizontal direction D1.

As illustrated in FIG. 1A, the line patterns of the first dummy active pattern 12d1 may be two, but example embodiments thereof are not limited thereto. For example, the line patterns of the first dummy active pattern 12d1 may be two or more than two.

In some example embodiments, the first external dummy active region 6d1 may further include a first dummy base pattern 9d1. The second external dummy active region 6d2 may further include a second dummy base pattern 9d2. The first dummy active pattern 12d1 may overlap the first dummy base pattern 9d1. The second dummy active pattern 12d2 may overlap the second dummy base pattern 9d2.

Next, a cross-sectional structure of a semiconductor device according to some example embodiments will be described with reference to FIGS. 1B and 1C.

Figure 1B:
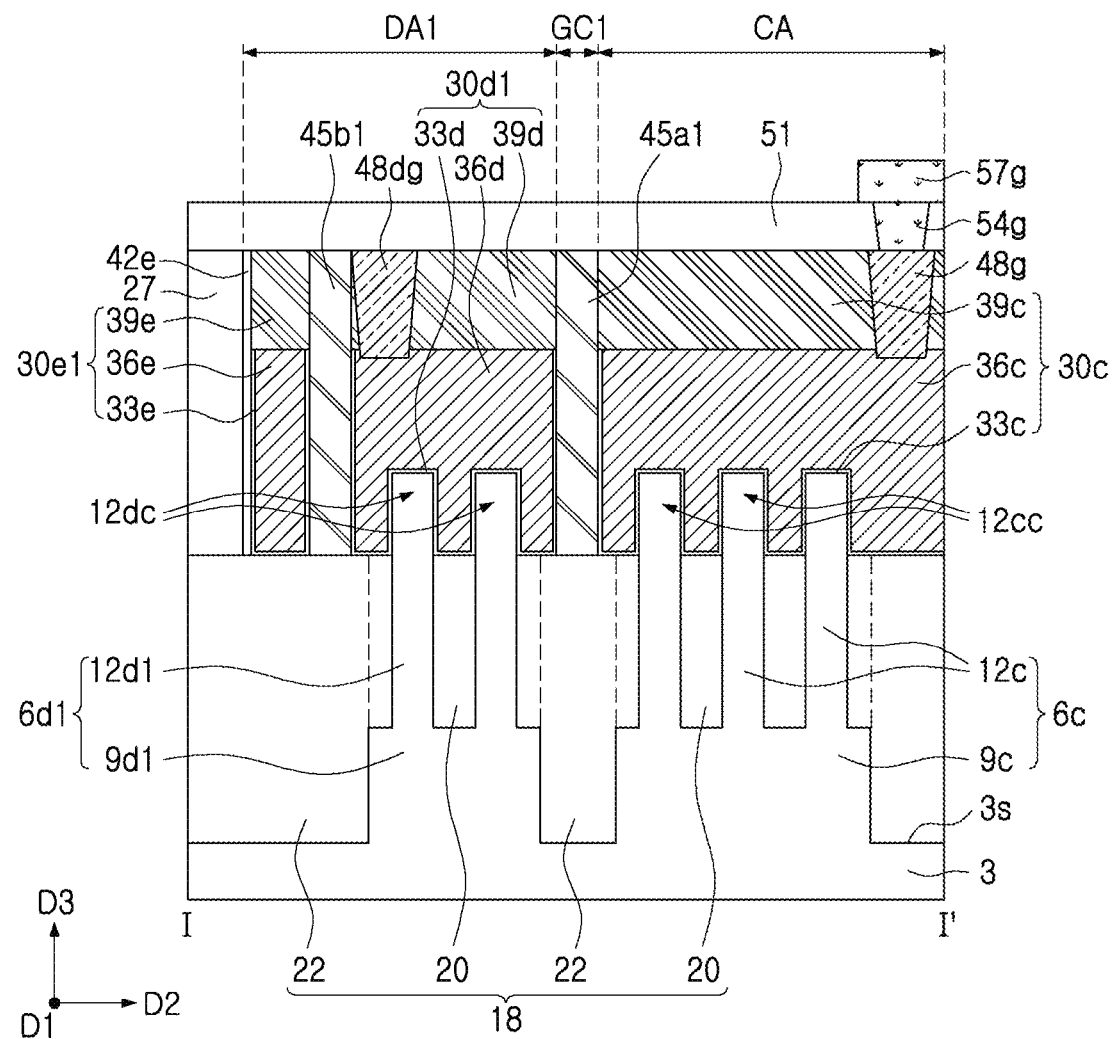
FIGS. 1B and 1C are cross-sectional views illustrating a semiconductor device according to some example embodiments.
Figure 1C:
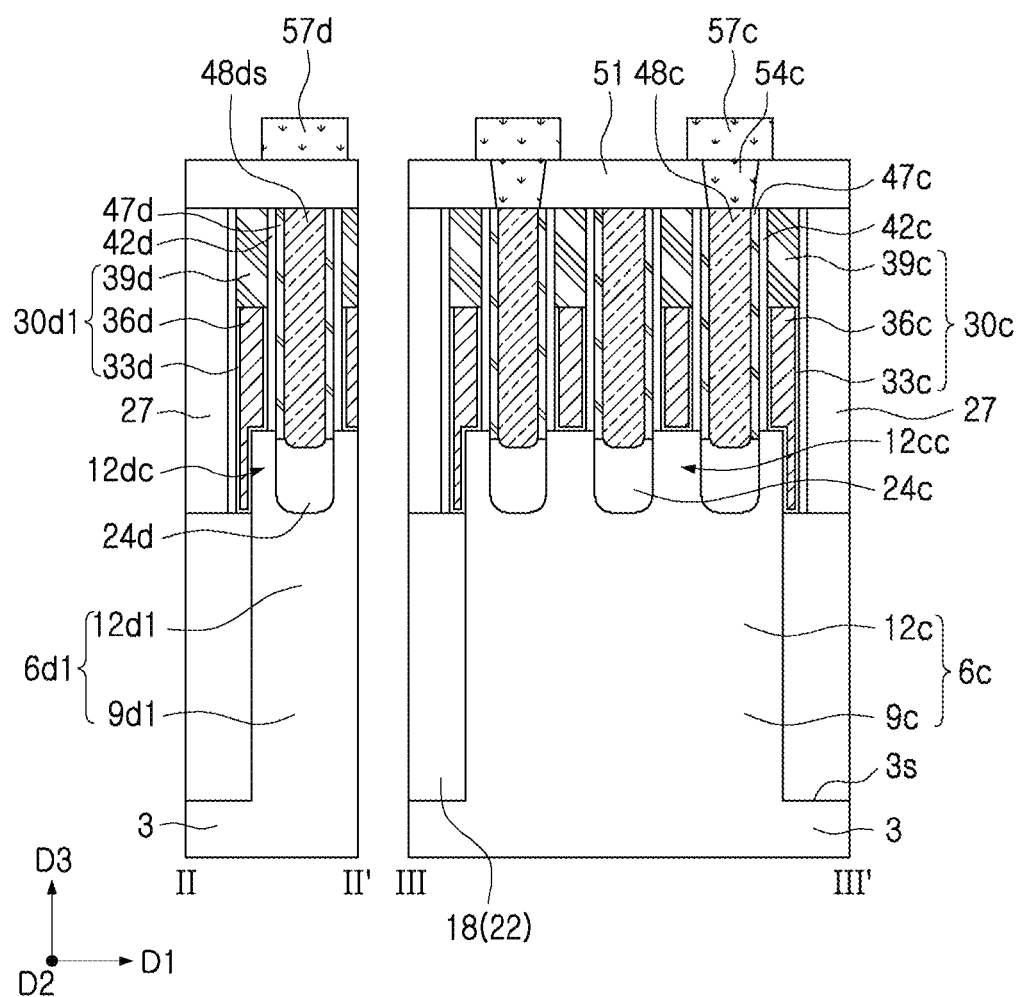

FIG. 1B is a cross-sectional view illustrating a region taken along line I-I' of FIG. 1A to describe a semiconductor device according to some example embodiments, and FIG. 1C is a cross-sectional view illustrating regions taken along lines II-IF and of FIG. 1A to describe a semiconductor device according to some example embodiments. In the cross-sectional structure of a semiconductor device according to some example embodiments with reference to FIGS. 1B and 1C, the components described with reference to FIG. 1A will be directly referred to without further descriptions. In addition, since the first external dummy area DA1 and the second external dummy area DA2 may be mirror symmetrical structures, the cross-sectional structure of the second external dummy area DA2 will not be described below. The cross-sectional structure of the second external dummy area DA2 may be mirror symmetrical to the cross-sectional structure of the first external dummy area DA1, and thus may be understood to be substantially the same as each other.

It will be understood that elements may be recited herein as being "the same" as other elements, and it will be further understood that elements recited herein as being "the same" as other elements may be "the same" or "substantially the same" as the other elements, where elements that are "substantially the same" as other elements will be understood to be the same as the other elements within manufacturing tolerances and/or material tolerances. Elements that are the same or substantially the same as other elements may be structurally the same or substantially the same, functionally the same or substantially the same, and/or compositionally the same or substantially the same.

Referring to FIGS. 1A, 1B and 1C, the semiconductor device 1 may further include a semiconductor substrate 3 and an isolation region 18 on the semiconductor substrate 3.

The circuit active pattern 12c may be disposed on the circuit base pattern 9c.

In the case of the circuit active pattern 12c, one or more circuit active patterns 12c may extend from an upper surface of the circuit base pattern 9c in a vertical direction D3. Accordingly, it will be understood that each circuit active region 6c may include the circuit base pattern 9c and one or more circuit active patterns 12c extending in the vertical direction from the circuit base pattern 9c. As shown in at least FIG. 1B, a width of a circuit base pattern 9c of a circuit active region 6c in the second horizontal direction may be greater than a width of each circuit active pattern 12c of the one or more circuit active patterns 12c of the circuit active region 6c in the second horizontal direction. The vertical direction D3 may be a direction perpendicular to an upper surface 3s of the semiconductor substrate 3. A first dummy active pattern 12d1 may be disposed on the first dummy base pattern 9d1. In the case of the first dummy active pattern 12d1, one or more first dummy active patterns 12d1 may extend from the upper surface of the first dummy base pattern 9d1 in the vertical direction D3. Accordingly, it will be understood that each first external dummy active region 6d1 may include the first dummy base pattern 9d1 and one or more first dummy active patterns 12d1 extending in the vertical direction from the first dummy base pattern 9d1. As shown in at least FIG. 1B, a width of a first dummy base pattern 9d1 of a first external dummy active region 6d1 in the second horizontal direction may be greater than a width of each first dummy active pattern 12d1 of the one or more first dummy active patterns 12d1 of the first external dummy active region 6d1 in the second horizontal direction.

The isolation region 18 may include a first isolation region 20 and a second isolation region 22. The first isolation region 20 may define the first dummy active pattern 12d1 and the circuit active pattern 12c, and the second isolation region 22 may define the first dummy base pattern 9d1 and the circuit base pattern 9c.

Each of the circuit active regions 6c may further include a circuit channel region 12cc extending from the circuit active pattern 12c in the vertical direction D3 and adjacent to a circuit source/drain region 24c.

The first external dummy active region 6d1 may further include a dummy channel region 12dc extending from the first dummy active pattern 12d1 in the vertical direction D3 and adjacent to a dummy source/drain region 24d.

Each of the circuit gate lines 30c may include a first gate dielectric layer 33c, a first gate electrode 36c, and a first gate capping layer 39c. The first gate dielectric layer 33c may cover side and bottom surfaces of the first gate electrode 36c. The first gate capping layer 39c may be disposed on the first gate electrode 36c.

Each of the first external dummy gate lines 30d1 may include a second gate dielectric layer 33d, a second gate electrode 36d, and a second gate capping layer 39d. The second gate dielectric layer 33d may cover side and bottom surfaces of the second gate electrode 36d. The second gate capping layer 39d may be disposed on the second gate electrode 36d.

The second gate dielectric layer 33d, the second gate electrode 36d, and the second gate capping layer 39d may be referred to as a dummy gate dielectric layer, a dummy gate electrode, and a dummy gate capping layer, respectively.

Each of the first edge gate lines 30e1 may include a third gate dielectric layer 33e, a third gate electrode 36e, and a third gate capping layer 39e. The third gate dielectric layer 33e may cover side and bottom surfaces of the third gate electrode 36e. The third gate capping layer 39e may be disposed on the third gate electrode 36e.

As shown in at least FIG. 1B, at least one of the circuit gate lines 30c may cover the upper and side surfaces of at least one of the circuit channel region 12cc of the circuit active pattern 12c (e.g., may directly contact said upper and side surfaces as shown) and may extend onto the isolation region 18.

As shown in at least FIG. 1B, at least one of the first external dummy gate lines 30d1 may cover the upper and side surfaces of at least one dummy channel region 12dc of the first dummy active pattern 12d1 (e.g., may directly contact said upper and side surfaces as shown) and may extend onto the isolation region 18.

Upper surfaces of the first gate electrodes 36c of the circuit gate lines 30c and the second gate electrodes 36d of the first external dummy gate lines 30d1 may be located on higher levels than the upper surface of the circuit channel region 12cc and the upper surface of the first dummy active pattern 12d1.

In some example embodiments, the semiconductor device 1 may further include a circuit source/drain region 24c and a dummy source/drain region 24d. Restated, the circuit area CA may include a circuit source/drain region 24c on (e.g., above) the circuit active regions 6c, and at least the first external dummy area DA1 may include a dummy source/drain region 24d on (e.g., above) the first external dummy active regions 6d1.

The circuit source/drain regions 24c may be disposed in plural, and may be adjacent to the circuit channel regions 12cc in the first horizontal direction D1, on the circuit active patterns 12c.

The first horizontal direction D1 may be parallel to the upper surface 3s of the semiconductor substrate 3.

The dummy source/drain region 24d may be provided as a plurality of dummy source/drain regions 24d, and the dummy source/drain regions 24d may be adjacent to the dummy channel region 12dc in the first horizontal direction D1, on the first dummy active patterns 12d1.

In some example embodiments, the semiconductor device 1 may further include an interlayer insulating layer 27 on the isolation region 18.

A first circuit contact plug 48c may be disposed on (e.g., directly on) the circuit source/drain region 24c, such that the first circuit contact plug 48c is configured to be electrically connected to the circuit source/drain region 24c. A second circuit contact plug 48g may be disposed on the first gate electrode 36c to penetrate through the first gate capping layer 39c.

In some example embodiments, a dummy source/drain contact plug 48ds may be disposed on the dummy source/drain region 24d.

In some example embodiments, a dummy gate contact plug 48dg penetrating through the first gate capping layer 39c may be disposed on the second gate electrode 36d.

In some example embodiments, the semiconductor device 1 may further include a first gate spacer 42c, a second gate spacer 42d, and a third gate spacer 42e.

The first gate spacer 42c may be interposed between the circuit gate lines 30c and the first circuit contact plug 48c and between the circuit gate lines 30c and the interlayer insulating layer 27.

The second gate spacer 42d may be interposed between the first external dummy gate lines 30d1 and the dummy source/drain contact plug 48ds, and may be interposed between the first external dummy gate lines 30d1 and the interlayer insulating layer 27. The third gate spacer 42e may be interposed between the first edge gate lines 30e1 and the interlayer insulating layer 27.

The first to third gate spacers 42c, 42d and 42e may be formed of an insulating material such as silicon nitride, silicon oxynitride, silicon oxide or the like.

In some example embodiments, the semiconductor device 1 may further include a first contact spacer 47c and a second contact spacer 47d. The first and second contact spacers 47c and 47d may be formed of an insulating material such as silicon oxide.

The first contact spacer 47c may surround the side surface of the first circuit contact plug 48c. The second contact spacer 47d may surround the side surface of the dummy source/drain contact plug 48ds.

In some example embodiments, the semiconductor device 1 may further include an upper insulating layer 51 disposed on the interlayer insulating layer 27, the circuit gate lines 30c, the first external dummy gate lines 30d1 and the first edge gate lines 30e1.

In some example embodiments, the semiconductor device 1 may further include a first circuit via 54c and a second circuit via 54g penetrating through the upper insulating layer 51.

The first circuit via 54c may be on, and in contact with the first circuit contact plug 48c, such that the first circuit via 54c is configured to be electrically connected to the first circuit contact plug 48c, and the second circuit via 54g may be in contact with the second circuit contact plug 48g.

In some example embodiments, the semiconductor device 1 may include a first circuit wiring 57c, a second circuit wiring 57g, and a dummy wiring 57d that are disposed at the same height level on the upper insulating layer 51 (e.g., at a same distance from the upper surface 3s of semiconductor substrate 3, such that the dummy wiring 57d overlaps the dummy source/drain region 24d in the vertical direction D3).

The first circuit wiring 57c may be electrically connected to the first circuit via 54c (e.g., based on being in contact therewith), and the second circuit wiring 57g may be electrically connected to the second circuit via 54g. The dummy wiring 57d may be electrically isolated (e.g., electrically insulated from the dummy source/drain region 24d). For example, the dummy wiring 57d may overlap the dummy source/drain region 24d and may be electrically insulated from the dummy source/drain region 24d.

Next, a modification of the cross-sectional structure of the region taken along line I-I' of FIG. 1B will be described with reference to FIG. 2A.

Figure 2A:
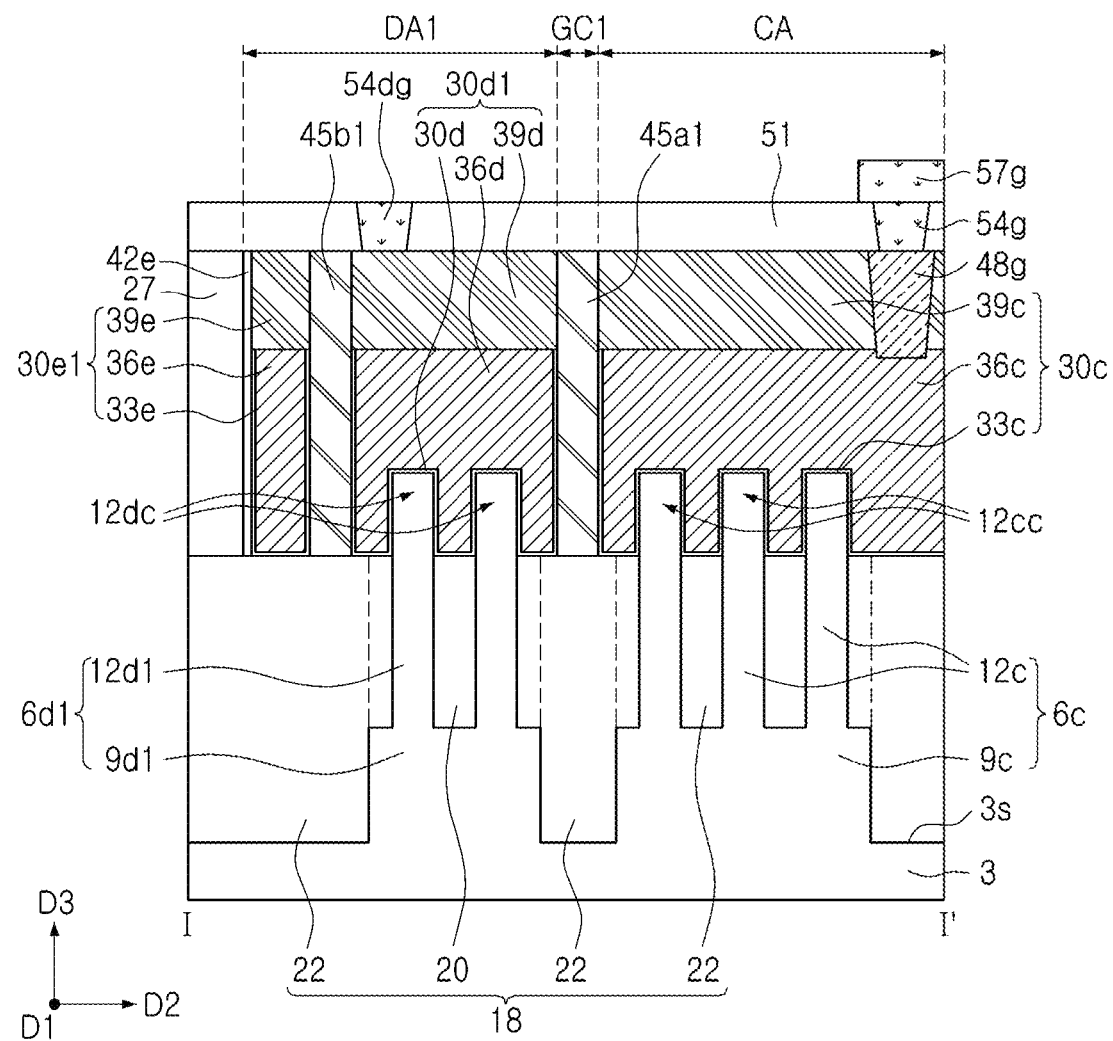
FIGS. 2A and 2B are cross-sectional views illustrating a modified example of a semiconductor device according to some example embodiments.

FIG. 2A is a cross-sectional view illustrating a modification of the cross-sectional structure of FIG. 1B.

In a variant, referring to FIG. 2A, the dummy gate contact plug (48dg in FIG. 1B) in FIG. 1B may be omitted. A dummy gate via 54dg (e.g., a "dummy via") penetrating through the upper insulating layer 51 and contacting the upper surface of the second gate capping layer 39d may be disposed. The dummy gate via 54dg may be electrically insulated from the second gate electrode, for example, the second gate electrode 36d. Accordingly, the first external dummy area DA1 may include one of the dummy gate contact plug (48dg in FIG. 1B) or the dummy gate via (54dg in FIG. 2A), on the second gate electrode 36d, and may not include the other (e.g., may include a dummy gate contact plug 48dg and not a dummy gate via 54dg, such that the dummy gate contact plug 48dg is electrically connected to a dummy source/drain region 24d and may be electrically insulated from dummy wiring 57d, or a dummy gate via 54dg and not a dummy gate contact plug 48dg, such that the dummy gate via 54dg is electrically insulated from the dummy source/drain region 24d and may be electrically connected to the dummy wiring 57d).

Next, a modification of the cross-sectional structure of the region taken along line II-IF of FIG. 1C will be described with reference to FIG. 2B.

Figure 2B:
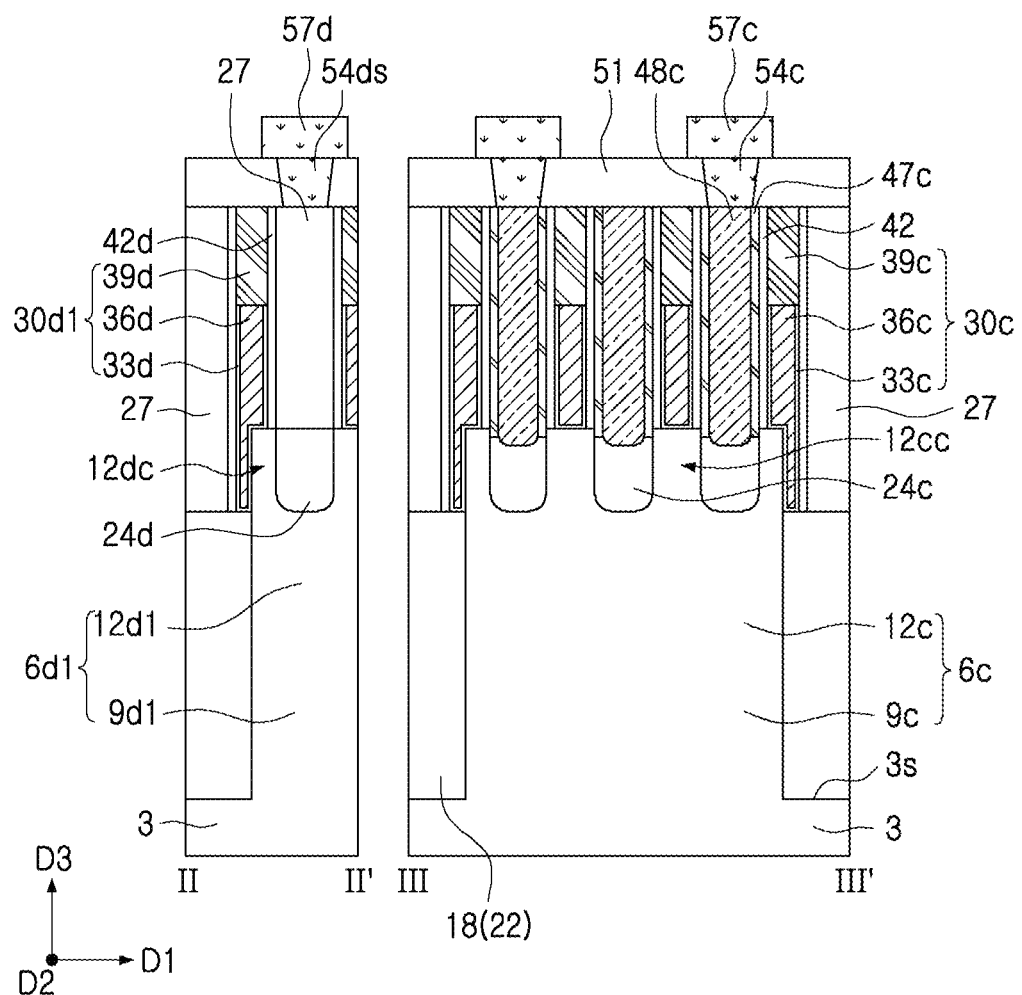

FIG. 2B is a cross-sectional view illustrating a modification of the cross-sectional structure of FIG. 1C.

In a variant, referring to FIG. 2B, regions from which the dummy source/drain contact plug (48ds of FIG. 1C) and the second contact spacer (47d of FIG. 1C) described in FIG. 1C are omitted and removed and the dummy source/drain contact plug (48ds of FIG. 1C) and the second contact spacer (47d of FIG. 1C) described in FIG. 1C are omitted and removed, may be filled with the interlayer insulating layer 27. Accordingly, the entire upper surface of the dummy source/drain region 24d may be covered by the interlayer insulating layer 27.

A dummy source/drain via 54ds may be formed to penetrate through the upper insulating layer 51, and may contact the interlayer insulating layer 27, above the dummy source/drain region 24d. The dummy source/drain via 54ds may contact the dummy wiring 57d of FIG. 1C. Accordingly, it will be understood that, in some example embodiments, the first external dummy area DA1 may include one of the dummy source/drain contact plug 48ds or the dummy source/drain via 54ds wherein, when the first external dummy area DA1 includes the dummy source/drain contact plug 48ds and does not include the dummy source/drain via 54ds (e.g., as shown in FIG. 1C), the dummy source/drain contact plug 48ds is electrically connected to the dummy source/drain region 24d and is electrically insulated from the dummy wiring 57d, and when the first external dummy area DA1 does not include the dummy source/drain contact plug 48ds and includes the dummy source/drain via 54ds (e.g., as shown in FIG. 2B), the dummy source/drain via 54ds is electrically insulated from the dummy source/drain region 24d and is electrically connected to the dummy wiring 57d.

The first external dummy area DA1 may include one of the dummy source/drain contact plug (48ds of FIG. 1C) described in FIG. 1C or the dummy source/drain via 54ds in FIG. 2B above the dummy source/drain region 24d, and may not include the other thereof. Therefore, the dummy source/drain region 24d may be electrically insulated from the dummy wiring 57d.

Next, a modified example of the components constituting the first dummy area DA1 of FIG. 1A will be described with reference to FIG. 3.

Figure 3:
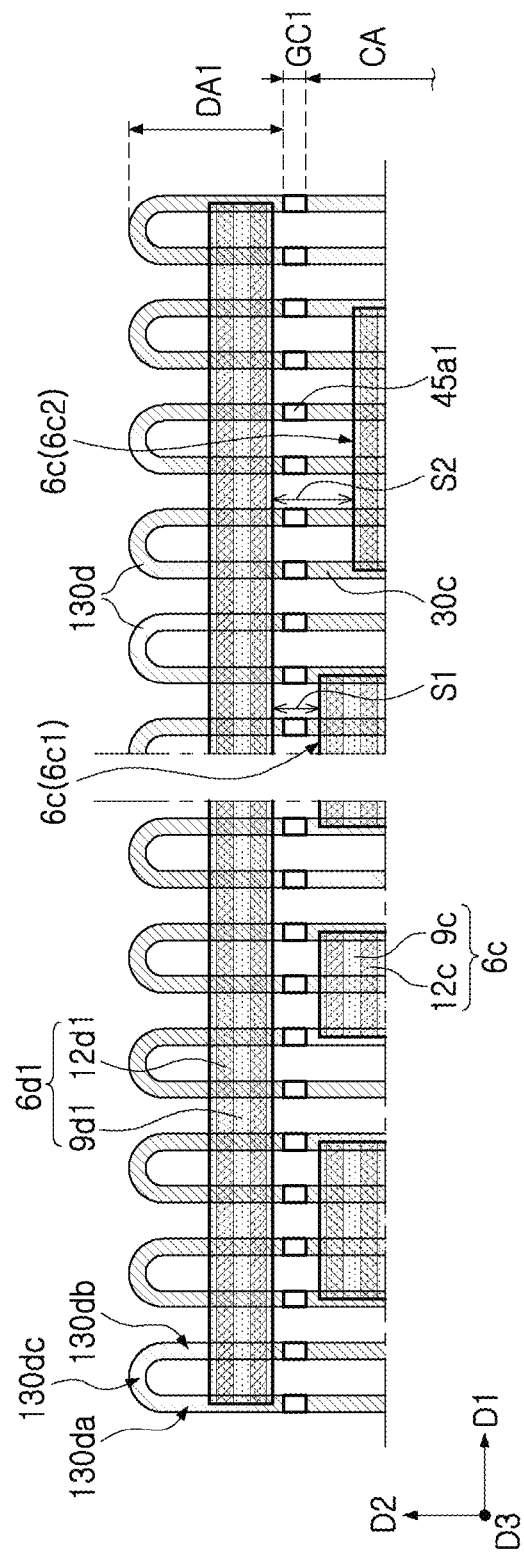
FIG. 3 is a plan view illustrating a modified example of a semiconductor device according to some example embodiments.

FIG. 3 is a partially enlarged plan view illustrating portions of the first dummy area DA1, the first gate cut insulation region GC1, and the circuit area CA of FIG. 1A.

In a modified example, referring to FIG. 3, in the first dummy area DA1, the first edge cut patterns 45b1 of FIG. 1A may be omitted, and the first edge gate lines 30e1 of FIG. 1A and the first external dummy gate lines 30d1 of FIG. 1A may be connected to each other to form dummy gate lines 130d. As shown in at least FIG. 3, when viewed in plan view, the first edge gate lines 30e1 of FIG. 1A and the first external dummy gate lines 30d1 of FIG. 1A may be continuously connected to each other (e.g., part of a single, continuous piece of material) to form the dummy gate lines 130d.

One of the dummy gate lines 130d may include line portions 130da and 130db and a connection portion 130dc connecting the line portions 130da and 130db. The line portions 130da and 130db may have the shape of lines or bars parallel to each other, and the connection portion 130dc may have a "U" shape.

Next, a modified example of the components constituting the first dummy area DA1 of FIG. 1A will be described with reference to FIG. 4.

Figure 4:
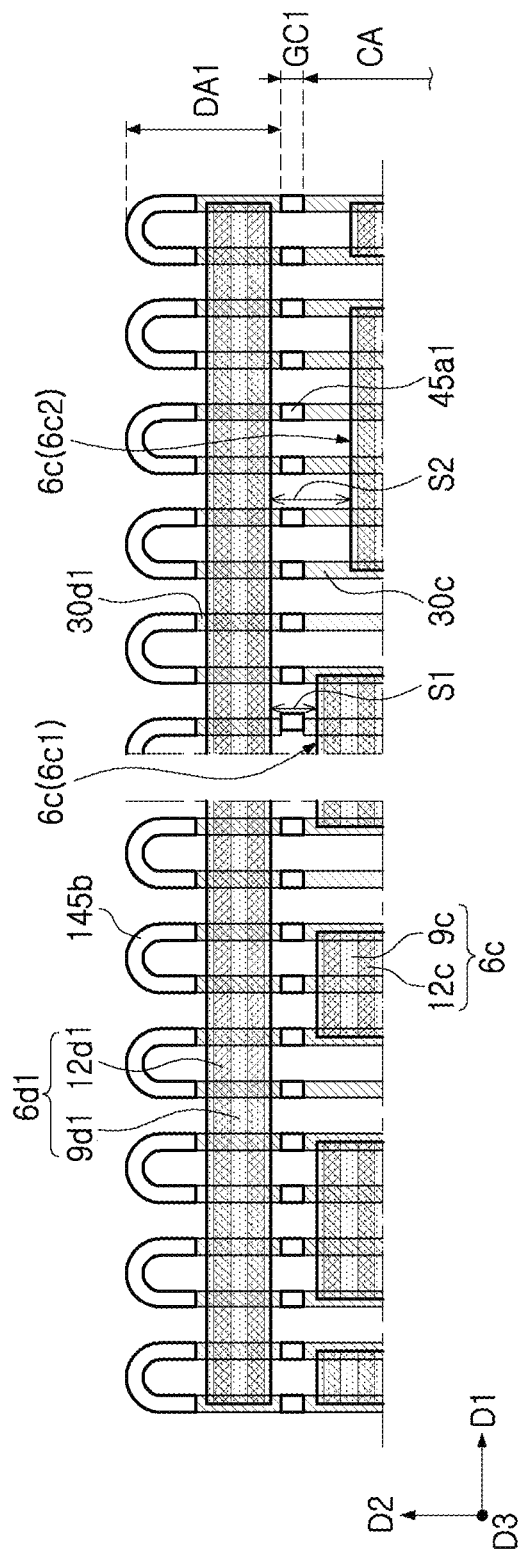
FIG. 4 is a plan view illustrating a modified example of a semiconductor device according to some example embodiments.

FIG. 4 is a partially enlarged plan view illustrating portions of the first dummy area DA1, the first gate cut insulation area GC1, and the circuit area CA of FIG. 1A.

In a modified example, referring to FIG. 4, in the first dummy area DA1, the first edge gate lines 30e1 described with reference to FIG. 1A may be replaced with the first edge cut patterns (45b1 in FIG. 1A). Accordingly, the first dummy area DA1 may include edge dummy patterns, at least portions of which are "U" shaped, which may be the edge cut patterns 145b, which may be formed of a same material as a material of the first gate cut patterns 45a1, or the first edge gate lines 30e1, which may be formed of a same material as a material of the first external dummy gate lines 30d1, and where the first external dummy gate lines 30d1 are between the edge dummy patterns (e.g., 145b or 30e1) and the first gate cut patterns 45a1. For example, the structure of the first edge gate lines 30e1 of FIG. 1A may be replaced with the same cross-sectional structure as that of the first edge cut patterns 45b1 of FIG. 1A. Accordingly, the first edge gate lines 30e1 of FIG. 1A and the first edge cut patterns 45b1 of FIG. 1A may be combined to form edge cut patterns 145b, at least portions of which (e.g., some or all of which) may have a "U" shape. The edge cut patterns 145b may have the same cross-sectional structure as that of the first edge cut patterns 45b1 of FIG. 1A.

Next, a modified example of the components constituting the first dummy area DA1 of FIG. 1A will be described with reference to FIG. 5.

Figure 5:
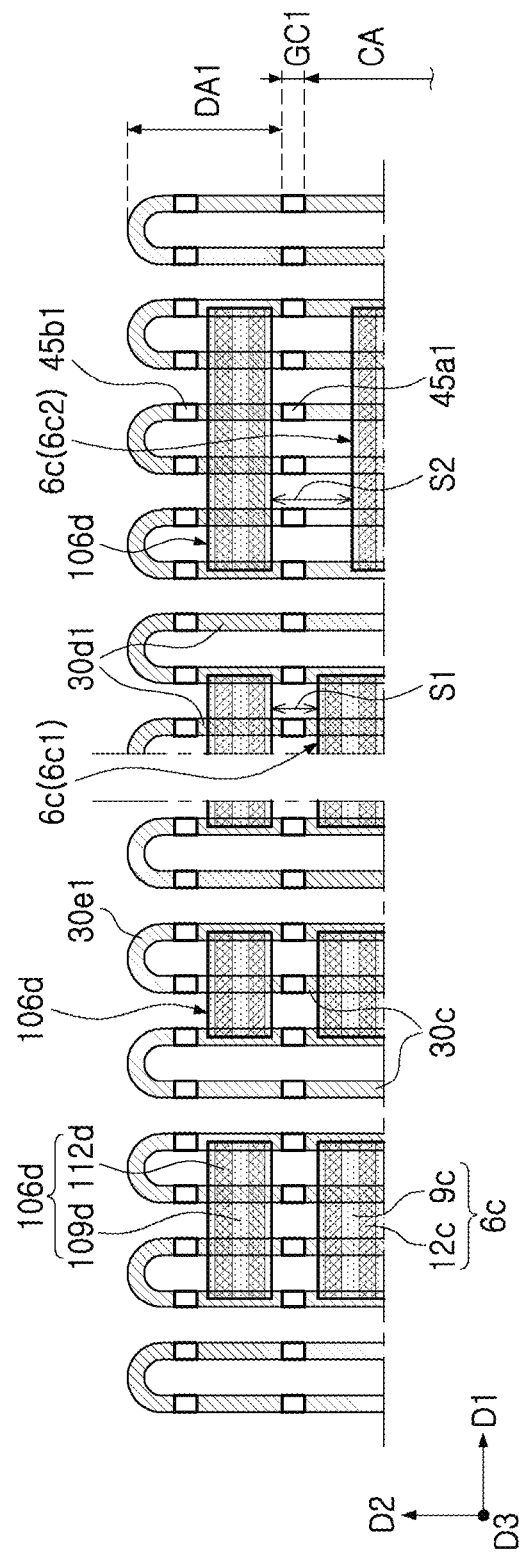
FIG. 5 is a plan view illustrating a modified example of a semiconductor device according to some example embodiments.

FIG. 5 is a partially enlarged plan view illustrating portions of the first dummy area DA1, the first gate cut insulation area GC1, and the circuit area CA of FIG. 1A.

In a modification, referring to FIG. 5, in the first dummy area DA1, the first external dummy active region (6d1 in FIG. 1A), which extends in the first horizontal direction D1 and may be (e.g., have) one linear shape, may be replaced with an external dummy active region 106d including active portions spaced apart from (e.g., isolated from direct contact with) each other and arranged in sequence (e.g., extending sequentially, extending in sequence, extending in series, etc.) in the first horizontal direction D1. It will be understood that elements extending sequentially in a direction may be referred to as a linear sequence of said elements.

Each of the active portions of the external dummy active region 106d may have a line or bar shape extending in the first horizontal direction D1.

As shown in at least FIG. 5, the circuit active regions 6c may include a plurality of circuit active regions 6c sequentially arranged (e.g., extending sequentially, extending in sequence, extending in series, etc.) in the first horizontal direction D1 while facing the active portions of the external dummy active region 106d.

Each of the active portions of the external dummy active region 106d may include a dummy active pattern 112d and a dummy base pattern 109d overlapping the dummy active pattern 112d. The dummy active pattern 112d and the dummy base pattern 109d may correspond to the first dummy active pattern 12d1 of FIG. 1A and the first dummy base pattern 9d1 of FIG. 1A, respectively.

As illustrated in FIG. 5, the external dummy active region 106d including the active portions spaced apart from each other while being sequentially arranged in the first horizontal direction D1 may replace the first external dummy active region 6d1 of FIGS. 3 and 4.

Next, a modification of the semiconductor device according to some example embodiments will be described with reference to FIG. 6.

Figure 6:
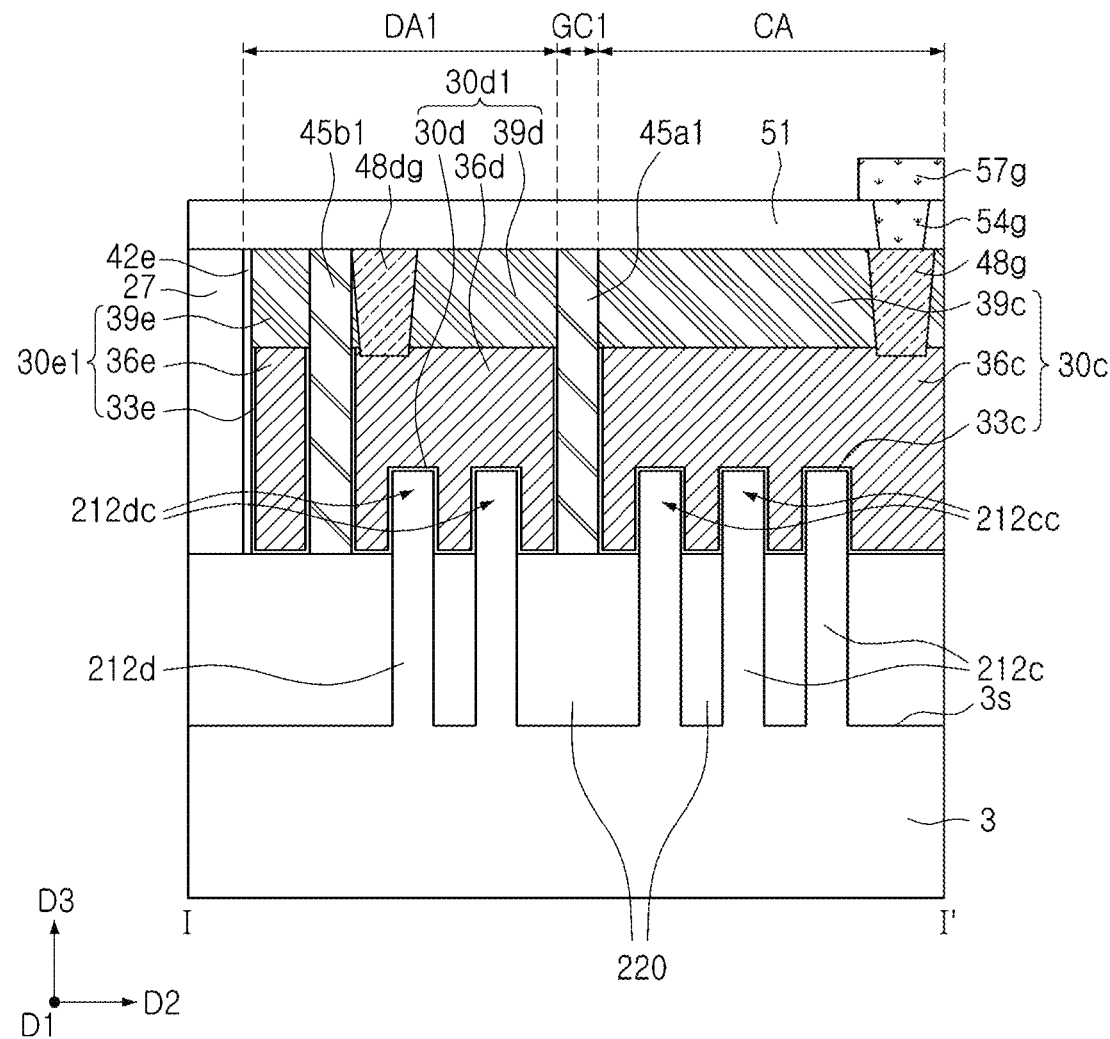
FIG. 6 is a cross-sectional view illustrating a modified example of a semiconductor device according to some example embodiments.

FIG. 6 is a cross-sectional view illustrating a modified example of the cross-sectional structure of FIG. 1B.

Referring to FIG. 6, the base patterns 9c, 9d1, 9d2, and 109d described with reference to FIGS. 1 to 5 may be omitted. For example, the first dummy base pattern 9d1 of FIG. 1B and the circuit base pattern 9c of FIG. 1B may be omitted. Accordingly, the first dummy active pattern 12d1 of FIG. 1B may be replaced with a dummy active pattern 212d extending in the vertical direction D3 from an upper surface 3s of a semiconductor substrate 3, including a dummy channel region 212dc extending from the dummy active pattern 212d in the vertical direction D3. The circuit active pattern (12c of FIG. 1B) described with reference to FIG. 1B may be replaced with a circuit active pattern 212c extending in the vertical direction D3 from the upper surface 3s of the semiconductor substrate 3, including a circuit channel region 212cc extending from the circuit active pattern 212c in the vertical direction D3. The vertical direction D3 may be perpendicular to the upper surface 3s of the semiconductor substrate 3.

The first isolation region 20 in FIG. 1B may be replaced with an isolation region 220 defining the dummy active pattern 212d and the circuit active pattern 212c.

Next, a modified example of the planar structure of the semiconductor device according to some example embodiments, including the example embodiments described with reference to FIG. 1A will be described with reference to FIG. 7A.

Figure 7A:
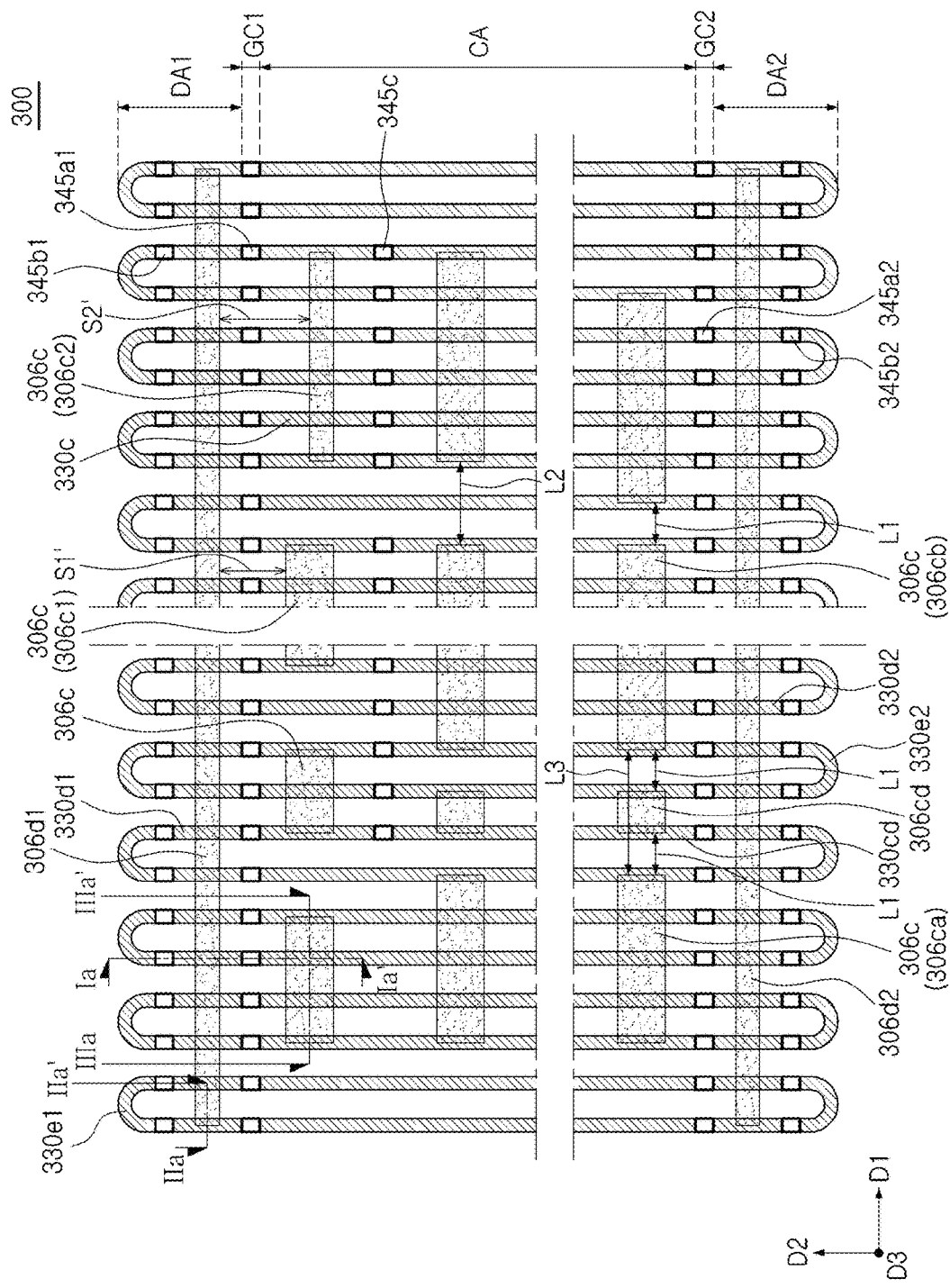
FIGS. 7A, 7B, and 7C are diagrams illustrating a modified example of a semiconductor device according to some example embodiments.

FIG. 7A is a plan view that may correspond to the plan view of FIG. 1A.

Referring to FIG. 7A, a semiconductor device 300 according to some example embodiments may include a first external dummy area DA1, a second external dummy area DA2 and a circuit area CA between the dummy area DA1 and the second external dummy area DA2, which are substantially the same as those described with reference to FIG. 1A. The semiconductor device 300 may include a first gate cut insulation region GC1 between the first external dummy area DA1 and the circuit area CA, and a second gate cut insulation region GC2 between the second external dummy area DA2 and the circuit area CA may be included. The second external dummy area DA2 and the circuit area CA may be substantially the same as those described with reference to FIG. 1A.

The circuit area CA may include circuit active regions 306c and circuit gate lines 330c. The circuit gate lines 330c may have substantially the same planar shape as that of the circuit gate lines (30c of FIG. 1A) described with reference to FIG. 1A.

The circuit active regions 306c may have a planar shape substantially similar to that of the circuit active regions (6c of FIG. 1A) described with reference to FIG. 1A.

The circuit area CA may further include an internal dummy active region 306cd corresponding to the internal dummy active region (6cd in FIG. 1A) described with reference to FIG. 1A, between circuit active regions 306ca and 306cb, and internal dummy gate lines 330cd corresponding to the internal dummy gate lines (30cd in FIG. 1A) described with reference to FIG. 1A.

The first external dummy area DA1 may further include a first external dummy active region 306d1 that may correspond to the first external dummy active region 6d1 of FIG. 1A, and first external dummy gate lines 330d1 that may correspond to the first external dummy gate lines 30d1 of FIG. 1A. The first external dummy area may further include first edge gate lines 330e1 that may correspond to the first edge gate lines 30e1 of FIG. 1A.

In some example embodiments, the separation distance S1' between the first external dummy active region 306d1 and the first side circuit active region 306c1 may be different from (e.g., smaller than) the separation distance S2' between the first external dummy active region 306d1 and the second side circuit active region 306c2.

The second external dummy area DA2 may include a second external dummy active region 306d2 that may correspond to the second external dummy active region 6d2 of FIG. 1A, and second external dummy gate lines 330d2 that may correspond to the second external dummy gate lines 330d2 of FIG. 1A. The second external dummy area DA2 may further include second edge gate lines 330e2 that may correspond to the second edge gate lines 30e2 of FIG. 1A.

The first gate cut region GC1 may include first gate cut patterns 345a1 corresponding to the first gate cut patterns 45a1 of FIG. 1A. The second gate cut region GC2 may include second gate cut patterns 345a2 corresponding to the second gate cut patterns 45a2 of FIG. 1A. The circuit area CA may further include circuit gate cut patterns 345c that may correspond to the circuit gate cut patterns 45c of FIG. 1A.

The first external dummy area DA1 may further include first edge cut patterns 345b1 that may correspond to the first edge cut patterns 45b1 of FIG. 1A. The second external dummy area DA2 may further include second edge cut patterns 345b2 that may correspond to the second edge cut patterns 45b2 of FIG. 1A.

Next, a modification of the semiconductor device according to some example embodiments will be described with reference to FIGS. 7B and 7C.

Figure 7B:
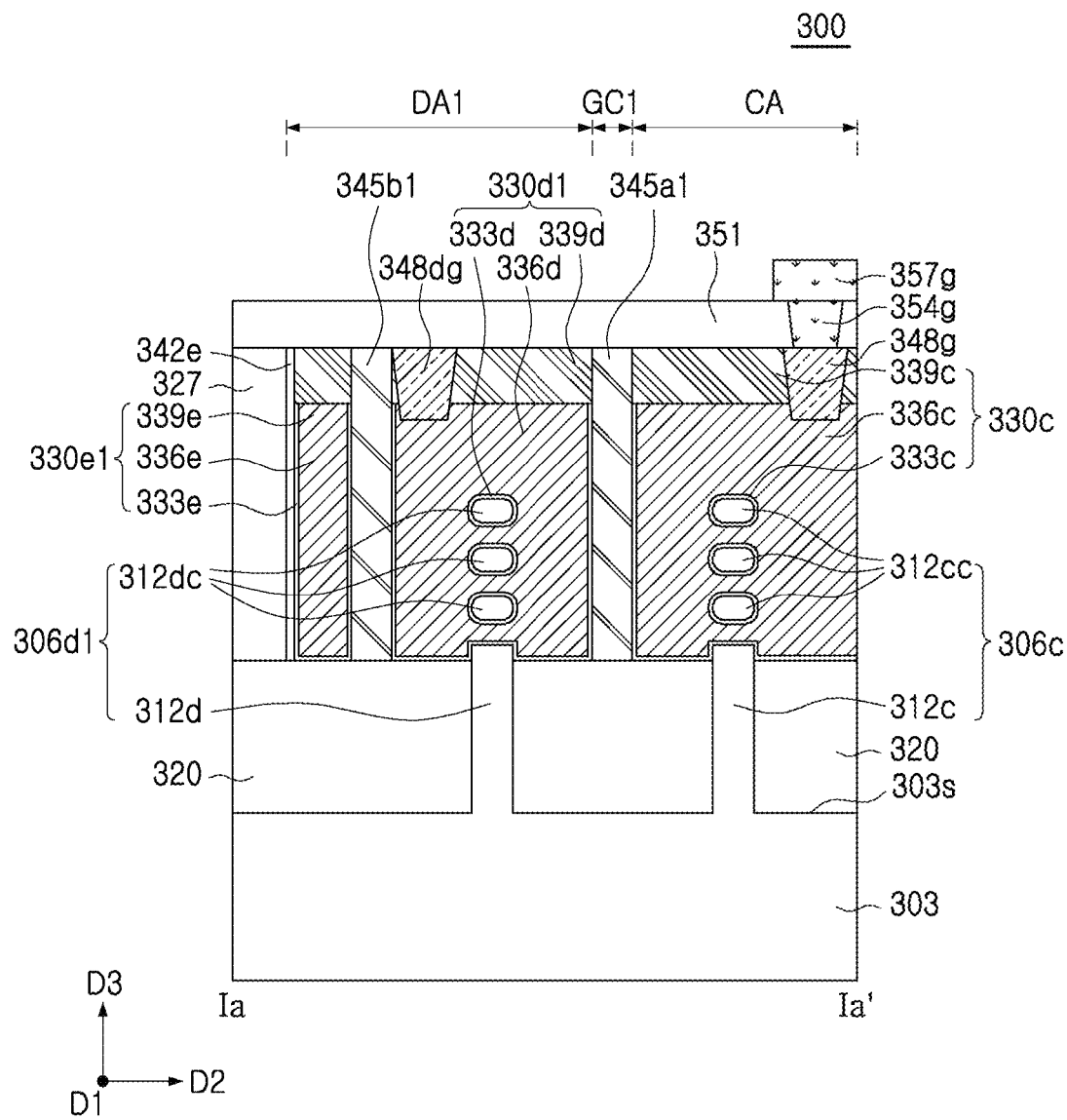
Figure 7C:
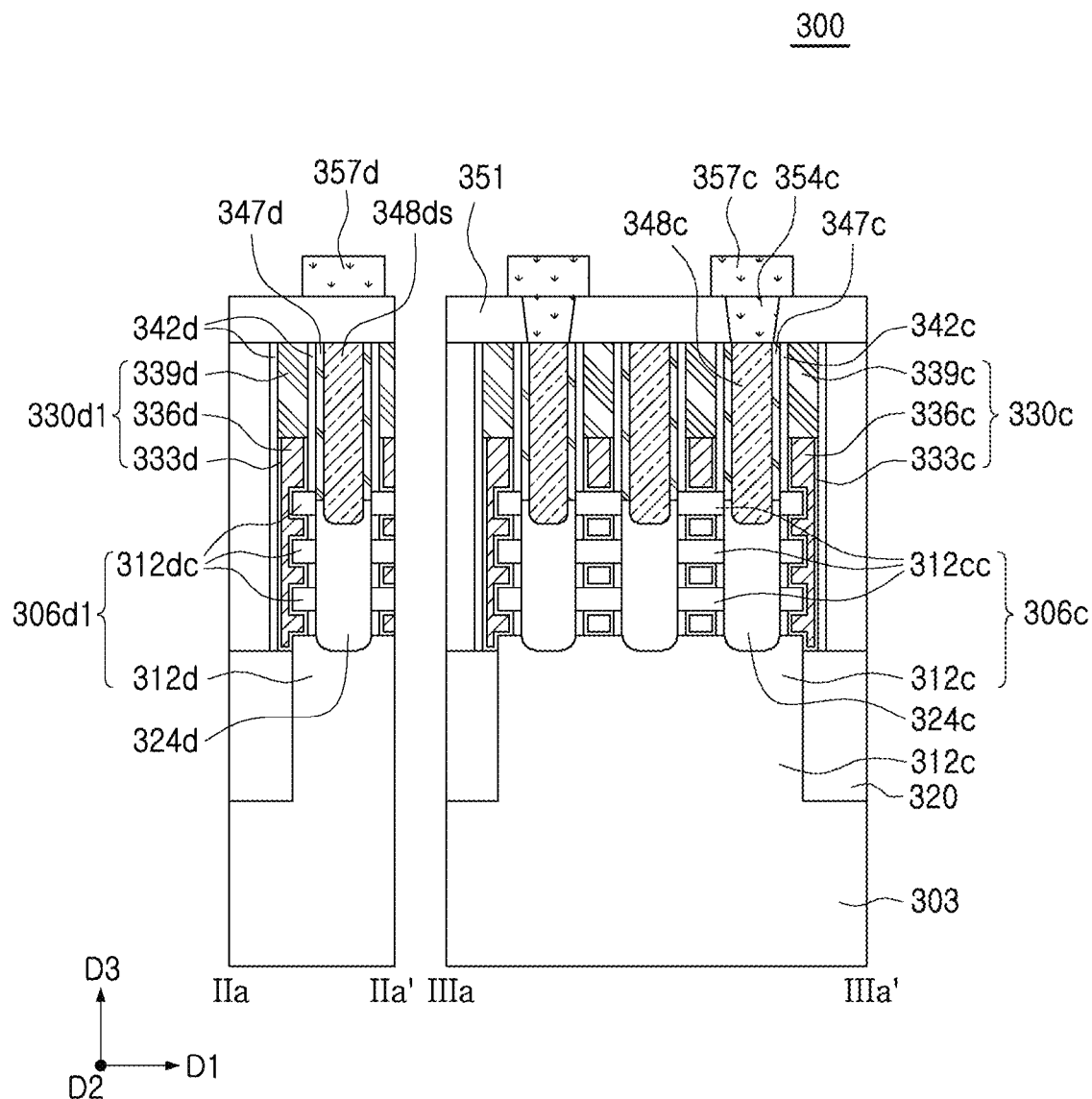

FIG. 7B is a cross-sectional view illustrating a region taken along line Ia-Ia' of FIG. 7A to describe a semiconductor device according to some example embodiments, and FIG. 7C is a cross-sectional view illustrating a region taken along line IIa-IIa' and a region taken along line IIIc-IIIa' of FIG. 7A to describe a semiconductor device according to some example embodiments.

Referring to FIGS. 7A, 7B, and 7C, the semiconductor device 300 may further include a semiconductor substrate 303 and an isolation region 320 on the semiconductor substrate 303.

The circuit active region 306c may include a circuit active pattern 312c extending in a vertical direction D3 from an upper surface 303s of the semiconductor substrate 303, and circuit active layers 312cc, spaced apart from each other in the vertical direction D3 (e.g., isolated from direct contact with each other and extending sequentially in the vertical direction D3 from the circuit active pattern 312c), on the circuit active pattern 312c and adjacent to the circuit source/drain region(s) 324c.

The first external dummy active region 306d1 may include a dummy active pattern 312d extending in the vertical direction D3 from the upper surface 303s of the semiconductor substrate 303, and dummy active layers 312dc spaced apart from each other in the vertical direction D3 (e.g., isolated from direct contact with each other and extending sequentially in the vertical direction D3 from the dummy active pattern 312d), on the dummy active pattern 312d. The isolation region 320 may define the dummy active pattern 312d and the circuit active pattern 312c and adjacent to the dummy source/drain region(s) 324d.

Each of the circuit gate lines 330c may include a first gate dielectric layer 333c, a first gate electrode 336c, and a first gate capping layer 339c. The first gate dielectric layer 333c may cover side and bottom surfaces of the first gate electrode 336c. The first gate capping layer 339c may be disposed on the first gate electrode 336c.

Each of the first external dummy gate lines 330d1 may include a second gate dielectric layer 333d, a second gate electrode 336d, and a second gate capping layer 339d. The second gate dielectric layer 333d may cover side and bottom surfaces of the second gate electrode 336d. The second gate capping layer 339d may be disposed on the second gate electrode 336d.

Each of the first edge gate lines 330e1 may include a third gate dielectric layer 333e, a third gate electrode 336e, and a third gate capping layer 339e. The third gate dielectric layer 333e may cover side and bottom surfaces of the third gate electrode 336e. The third gate capping layer 339e may be disposed on the third gate electrode 336e.

The circuit gate lines 330c may extend onto the isolation region 320 while surrounding the respective circuit active layers 312cc. For example, as shown in at least FIG. 7B, at least one of the circuit gate lines 330c may extend in the second horizontal direction D2 to cover an upper surface, a bottom surface and one or more (or all) side surfaces of each of the circuit active layers 312cc.

The first external dummy gate lines 330d1 may extend onto the isolation region 320 while surrounding the dummy active layers 312dc. For example, at least one of the first external dummy gate lines 330d1 may extend in the second horizontal direction D2 to cover an upper surface, a bottom surface and one or more (or all) side surfaces of each of the dummy active layers 312dc.

In some example embodiments, the semiconductor device 300 may further include a circuit source/drain region 324c and a dummy source/drain region 324d.

The circuit source/drain regions 324c may be disposed in plural, and may be adjacent to the circuit active layers 312cc in the first horizontal direction D1, on the circuit active patterns 12c.

The dummy source/drain region 324d may be disposed in plural, and may be adjacent to the dummy active layers 312dc in the first horizontal direction D1, on the dummy active patterns 312d.

In some example embodiments, the semiconductor device 300 may further include an interlayer insulating layer 327 on the isolation region 320.

A first circuit contact plug 348c may be disposed on the circuit source/drain region 324c. A second circuit contact plug 348g penetrating through the first gate capping layer 339c may be disposed on the first gate electrode 336c.

In some example embodiments, a dummy source/drain contact plug 348ds may be disposed on the dummy source/drain region 324d.

In some example embodiments, a dummy gate contact plug 348dg may be disposed on the second gate electrode 336d, to penetrate through the first gate capping layer 339c.

In some example embodiments, the semiconductor device 300 may further include a first gate spacer 342c, a second gate spacer 342d, and a third gate spacer 342e.

The first gate spacer 342c may be interposed between the circuit gate lines 330c and the first circuit contact plug 348c and between the circuit gate lines 330c and the interlayer insulating layer 327.

The second gate spacer 342d may be interposed between the first external dummy gate lines 330d1 and the dummy source/drain contact plug 348ds, and may be interposed between the first external dummy gate lines 330d1 and the interlayer insulating layer 327. The third gate spacer 342e may be interposed between the first edge gate lines 330e1 and the interlayer insulating layer 327.

In some example embodiments, the semiconductor device 300 may further include a first contact spacer 347c and a second contact spacer 347d. The first and second contact spacers 347c and 347d may be formed of an insulating material such as silicon oxide or the like.

The first contact spacer 347c may surround the side surface of the first circuit contact plug 348c. The second contact spacer 347d may surround the side surface of the dummy source/drain contact plug 348ds.

In some example embodiments, the semiconductor device 300 may further include an upper insulating layer 351 disposed on the interlayer insulating layer 327, the circuit gate lines 330c, the first external dummy gate lines 330d1 and the first edge gate lines 330e1.

In some example embodiments, the semiconductor device 300 may further include a first circuit via 354c and a second circuit via 354g penetrating through the upper insulating layer 351.

The first circuit via 354c may be in contact with the first circuit contact plug 348c, and the second circuit via 354g may be in contact with the second circuit contact plug 348g.

In some example embodiments, the semiconductor device 300 may include a first circuit wiring 357c, a second circuit wiring 357g and a dummy wiring 357d disposed on the same level of height on the upper insulating layer 351.

The first circuit wiring 357c may be electrically connected to the first circuit via 354c, and the second circuit wiring 357g may be electrically connected to the second circuit via 354g. The dummy wiring 357d may overlap the dummy source/drain region 324d and may be electrically insulated from the dummy source/drain region 324d.

In some example embodiments, the dummy source/drain contact plug 348ds may be omitted, while the dummy source/drain via (54ds in FIG. 2B), as in FIG. 2B, overlapping the dummy source/drain region 324d, may also be disposed.

In some example embodiments, the first external dummy active region 306d1 and the circuit active regions 306c may replace the first external dummy active region 6d1 and the circuit active regions 6c illustrated in FIGS. 1A through 5, respectively.

According to some example embodiments, by disposing the first and second external dummy areas DA1 and DA2 adjacent to the circuit area CA, reliability of the circuit active regions 6c and 306c positioned on the ends of the circuit gate lines 30c and 330c in the second horizontal direction D2 in the circuit area CA may be improved.

According to some example embodiments, the semiconductor devices 1 and 300 may include the first and second external dummy areas DA1 and DA2 adjacent to the circuit area CA, thereby preventing the reliability of the circuit active regions 6c and 306c from being lowered even when the size of the circuit active regions 6c and 306c is reduced to increase the degree of integration.

Accordingly, a semiconductor device having a planar layout, capable of increasing the reliability of the circuit active regions 6c and 306c positioned on the ends of the circuit gate lines 30c and 330c in the second horizontal direction D2, and a semiconductor device having a cross-sectional structure provided by such layout, may be provided.

As set forth above, according to some example embodiments, a layout capable of increasing reliability of circuit active regions adjacent to end portions of gate lines, and a semiconductor device disposed by the layout, may be provided.

While example embodiments have been illustrated and described above, it will be apparent to those skilled in the art that modifications and variations could be made without departing from the scope of the present inventive concepts as defined by the appended claims.

What is claimed is:

1. A semiconductor device, comprising:
a first external dummy area;
a second external dummy area; and
a circuit area between the first external dummy area and the second external dummy area,
wherein the circuit area includes internal active regions and internal gate lines,
wherein the first external dummy area includes a first external dummy active region and first external dummy gate lines overlapping the first external dummy active region in a vertical direction,
wherein the second external dummy area includes a second external dummy active region and second external dummy gate lines overlapping the second external dummy active region in the vertical direction,
wherein the internal active regions include a first circuit active region, an internal dummy active region, and a second circuit active region sequentially arranged in a first horizontal direction,
wherein each of the internal gate lines extends in a second horizontal direction perpendicular to the first horizontal direction,
wherein the first circuit active region has a first side facing the internal dummy active region,
wherein the second circuit active region has a second side facing the internal dummy active region,
wherein the internal dummy active region has a third side facing the first side of the first circuit active region and a fourth side facing the second side of the second circuit active region,
wherein the internal gate lines include a first gate line, a second gate line, a third gate line, a fourth gate line, a fifth gate line, and a sixth gate line sequentially arranged in the first horizontal direction,
wherein the first gate line overlaps a first active portion of the first circuit active region in the vertical direction,
wherein the second gate line overlaps the first side of the first circuit active region in the vertical direction,
wherein the third gate line overlaps the third side of the internal dummy active region,
wherein the fourth gate line overlaps the fourth side of the internal dummy active region,
wherein the fifth gate line overlaps the second side of the second circuit active region in the vertical direction, and
wherein the sixth gate line overlaps a second active portion of the second circuit active region in the vertical direction.

2. The semiconductor device of claim 1,
wherein a width of each of the first circuit active region and the second circuit active region is greater than a width of the internal dummy active region in the first horizontal direction.

3. The semiconductor device of claim 1,
wherein a distance between the first circuit active region and the internal dummy active region is a same distance as a distance between the second circuit active region and the internal dummy active region.

4. The semiconductor device of claim 1,
wherein a distance between the first circuit active region and the internal dummy active region is greater than a distance between the second gate line and the third gate line, and
wherein a distance between the second circuit active region and the internal dummy active region is greater than a distance between the fourth gate line and the fifth gate line.

5. The semiconductor device of claim 1,
wherein the first circuit active region includes
a first circuit active pattern, and
first active layers on the first circuit active pattern and spaced apart from each other in the vertical direction,
wherein the second circuit active region includes
a second circuit active pattern, and
second active layers on the second circuit active pattern and spaced apart from each other in the vertical direction, and
wherein the internal dummy active region includes
an internal dummy active pattern, and
internal dummy active layers on the internal dummy active pattern and spaced apart from each other in the vertical direction.

6. The semiconductor device of claim 5,
wherein the first gate line extends in the second horizontal direction to cover an upper surface, a bottom surface and a side surface of each first active layer of the first active layers, and
wherein the second gate line extends in the second horizontal direction to cover an upper surface, a bottom surface and a side surface of each second active layer of the second active layers.

7. The semiconductor device of claim 1,
wherein the internal active regions are between the first external dummy active region and the second external dummy active region, and
wherein the first external dummy gate lines and the second external dummy gate lines are spaced apart from the internal gate lines.

8. The semiconductor device of claim 1,
wherein each dummy active region of the first external dummy active region and the second external dummy active region has
a linear shape extending in the first horizontal direction, or
a shape including active portions isolated from direct contact with each other and extending sequentially in the first horizontal direction.

9. The semiconductor device of claim 1, further comprising:
a first gate cut insulation region between the first external dummy area and the circuit area; and
a second gate cut insulation region between the second external dummy area and the circuit area,
wherein the first gate cut insulation region includes first gate cut patterns between the internal gate lines and the first external dummy gate lines, and
wherein the second gate cut insulation region includes second gate cut patterns between the internal gate lines and the second external dummy gate lines.

10. The semiconductor device of claim 1,
wherein the first external dummy area further includes first edge gate lines,
wherein the first external dummy gate lines are between the first edge gate lines and the internal gate lines,
wherein the first external dummy gate lines have a shape of lines or bars parallel to each other, and
wherein at least portions of the first edge gate lines are "U" shaped.

11. The semiconductor device of claim 10, wherein the first external dummy area further comprises first edge cut patterns between the first edge gate lines and the first external dummy gate lines to isolate the first edge gate lines and the first external dummy gate lines from direct contact with each other.

12. The semiconductor device of claim 10, wherein when viewed in plan view, the first edge gate lines and the first external dummy gate lines are part of a single, continuous piece of material.

13. A semiconductor device, comprising:
active patterns spaced apart from each other and including a circuit active pattern and a dummy active pattern;
source/drain regions on the active patterns;
active layers on the active patterns; and
wirings on vias, wherein the source/drain regions include
- a circuit source/drain region on the circuit active pattern and including a first side and a second side opposing the first side, and
- a dummy source/drain region on the dummy active pattern and including a third side and a fourth side opposing the third side, wherein the active layers include
- first circuit active layers on the circuit active pattern, spaced apart from each other in a vertical direction, and adjacent to the first side of the circuit source/drain region,
- second circuit active layers on the circuit active pattern, spaced apart from each other in the vertical direction, and adjacent to the second side of the circuit source/drain region,
- first dummy active layers on the dummy active pattern, spaced apart from each other in the vertical direction, and adjacent to the third side of the dummy source/drain region, and
- second dummy active layers on the dummy active pattern, spaced apart from each other in the vertical direction, and adjacent to the fourth side of the dummy source/drain region, wherein the wirings include a circuit wiring electrically connected to the circuit source/drain region, and
wherein the wirings are electrically insulated from the dummy source/drain region.

14. The semiconductor device of claim 13, further comprising:
contact plugs on the source/drain regions,
wherein the contact plugs include
- a circuit contact plug on and in contact with the circuit source/drain region, and
- a dummy contact plug on and in contact with the dummy source/drain region.

15. The semiconductor device of claim 14, further comprising:
an upper insulating layer on the contact plugs; and
a circuit via penetrating through the upper insulating layer and contacting the circuit contact plug,
wherein the wirings are disposed on the upper insulating layer,
wherein the circuit via and the circuit contact plug are between the circuit wiring and the circuit source/drain region, and
wherein the circuit wiring is electrically connected to the circuit source/drain region by the circuit via and the circuit contact plug.

16. The semiconductor device of claim 15,
wherein the wirings further include a first wiring, and
wherein the first wiring vertically overlaps the dummy contact plug and is spaced apart from the dummy contact plug by the upper insulating layer.

17. The semiconductor device of claim 13, further comprising:
circuit gate lines and dummy gate lines,
wherein the circuit gate lines include
- a first circuit gate line vertically overlapping the first circuit active layers, and
- a second circuit gate line vertically overlapping the second circuit active layers, and wherein the dummy gate lines include
- a first dummy gate line vertically overlapping the first dummy active layers, and
- a second dummy gate line vertically overlapping the second dummy active layers.

18. The semiconductor device of claim 17,
wherein the first dummy gate line vertically overlaps a side of the dummy active pattern.

19. The semiconductor device of claim 17, further comprising:
an isolating region on a side of the dummy active pattern,
wherein the first dummy gate line vertically overlaps a portion of the dummy active pattern and a portion of the isolation region.

20. A semiconductor device, comprising:
internal active regions including a first circuit active region, an internal dummy active region, and a second circuit active region sequentially arranged in a first horizontal direction; and
internal gate lines including a first gate line, a second gate line, a third gate line, a fourth gate line, a fifth gate line, and a sixth gate line sequentially arranged in the first horizontal direction,
wherein each of the internal gate lines extends in a second horizontal direction perpendicular to the first horizontal direction,
wherein the first circuit active region has a first side facing the internal dummy active region,
wherein the second circuit active region has a second side facing the internal dummy active region,
wherein the internal dummy active region has a third side facing the first side of the first circuit active region and a fourth side facing the second side of the second circuit active region,
wherein the first gate line overlaps a first active portion of the first circuit active region in a vertical direction,
wherein the second gate line overlaps the first side of the first circuit active region in the vertical direction,
wherein the third gate line overlaps the third side of the internal dummy active region,
wherein the fourth gate line overlaps the fourth side of the internal dummy active region,
wherein the fifth gate line overlaps the second side of the second circuit active region in the vertical direction,
wherein the first circuit active region includes
- a first circuit active pattern, and
- first active layers on the first circuit active pattern and spaced apart from each other in the vertical direction, wherein the second circuit active region includes
- a second circuit active pattern, and
- second active layers on the second circuit active pattern and spaced apart from each other in the vertical direction, wherein the internal dummy active region includes
- an internal dummy active pattern, and
- internal dummy active layers on the internal dummy active pattern and spaced apart from each other in the vertical direction, wherein the first gate line extends in the second horizontal direction to cover an upper surface, a bottom surface and a side surface of each first active layer of the first active layers, and
wherein the second gate line extends in the second horizontal direction to cover an upper surface, a bottom surface and a side surface of each second active layer of the second active layers.

* * * * *